US007916550B2

(12) United States Patent
Kuo

(10) Patent No.: US 7,916,550 B2
(45) Date of Patent: Mar. 29, 2011

(54) METHOD AND APPARATUS FOR OPERATING NONVOLATILE MEMORY WITH FLOATING VOLTAGE AT ONE OF THE SOURCE AND DRAIN REGIONS

(75) Inventor: Ming-Chang Kuo, Changhua County (TW)

(73) Assignee: Macronix International Co., Ltd., Hsinchu (TW)

( * ) Notice: Subject to any disclaimer, the term of this patent is extended or adjusted under 35 U.S.C. 154(b) by 674 days.

(21) Appl. No.: 11/560,971

(22) Filed: Nov. 17, 2006

(65) Prior Publication Data

US 2008/0117690 A1    May 22, 2008

(51) Int. Cl.
    *G11C 11/34* (2006.01)
(52) U.S. Cl. .......... 365/185.26; 365/185.18; 365/185.17
(58) Field of Classification Search ............. 365/185.05, 365/185.03, 185.16, 185.18, 185.26, 185.27, 365/185.28, 185.17
    See application file for complete search history.

(56) References Cited

U.S. PATENT DOCUMENTS

| | | | | |
|---|---|---|---|---|
| 5,559,735 A * | 9/1996 | Ono et al. | ........... | 365/185.3 |
| 5,822,242 A * | 10/1998 | Chen | ........... | 365/185.01 |
| 5,877,524 A * | 3/1999 | Oonakado et al. | ........... | 257/321 |
| 6,011,725 A | 1/2000 | Eitan | | |
| 6,172,397 B1 * | 1/2001 | Oonakado et al. | ........... | 257/321 |
| 6,215,148 B1 * | 4/2001 | Eitan | ........... | 257/316 |
| 6,266,280 B1 | 7/2001 | Lee | | |
| 7,394,702 B2 * | 7/2008 | Ding et al. | ........... | 365/185.29 |
| 2004/0145950 A1 * | 7/2004 | Yeh et al. | ........... | 365/185.28 |
| 2005/0030789 A1 * | 2/2005 | Hsu et al. | ........... | 365/185.03 |
| 2005/0213385 A1 * | 9/2005 | Hosono et al. | ........... | 365/185.17 |
| 2006/0146603 A1 * | 7/2006 | Kuo et al. | ........... | 365/177 |

FOREIGN PATENT DOCUMENTS

CN    1753168 A    3/2006

OTHER PUBLICATIONS

C.C. Yeh et al. "PHINES: A Novel Low Power Program/Erase, Small Pitch, 2-Bit Per Cell Flash Memory," IEEE IEDM 2002, pp. 931-934.
Ilzuka et al. "Electrically Alterable Avalanche-Injection-Type MOS Read-Only Memory with Stacked-Gate Structure," IEEE Transactions on Electron Devices, vol. Ed-23, No. 4, Apr. 1976, pp. 379-387.

* cited by examiner

*Primary Examiner* — Van Thu Nguyen
*Assistant Examiner* — Douglas King
(74) *Attorney, Agent, or Firm* — Kenta Suzue; Haynes Beffel & Wolfeld LLP

(57) ABSTRACT

Methods and apparatuses are discussed which operate a nonvolatile memory cell or at least one cell in an array of such cells, such that a drain region or a source region is floating while adding charge to the charge storage structure.

2 Claims, 9 Drawing Sheets

METHOD AND APPARATUS FOR OPERATING NONVOLATILE MEMORY WITH FLOATING VOLTAGE AT ONE OF THE SOURCE AND DRAIN REGIONS

BACKGROUND OF THE INVENTION

1. Field of the Invention

The technology is related to nonvolatile memory in generally. In particular, the technology relates to operating a nonvolatile memory cell or nonvolatile memory array such that for at least one memory cell, a drain region or source region is floating, while adding charge.

2. Description of Related Art

FIGS. 1A and 1B show a prior art operations being performed on a nonvolatile memory cell to add electrons to a floating gate and a charge trapping structure, respectively. The bias arrangements shown require a relatively high gate voltage, and the operation takes a relatively long time. Accordingly, it would be desirable to perform an operation to add charge to the charge storage structure with lower voltage magnitudes or faster speed.

SUMMARY OF THE INVENTION

One aspect of the technology is a nonvolatile memory cell, comprising a gate, a source region and a drain region at least partly in a substrate region, a charge storage structure, one or more dielectric regions, and circuitry controlling the gate, source region, and drain region. The dielectric regions are at least partly between the charge storage structure and the gate, and at least partly between the charge storage structure and the substrate region. The circuitry is responsive to an instruction to move electrons to the charge storage structure, by floating only one region of the source region and the drain region, while applying some voltage to another region of the source region and the drain region. For example, if the circuitry floats only the source region, then some voltage is applied to the drain region. Alternatively, if the circuitry floats only the drain region, then some voltage is applied to the source region.

Another aspect of the technology is a method of operating a nonvolatile memory cell, as follows. In response to an instruction to move electrons to the charge storage structure, floating only one region of the source region and the drain region, while applying some voltage to another region of the source region and the drain region.

In some embodiments, the voltage applied to the nonfloating region ("another region") is part of a bias arrangement applied to other terminals (e.g., body region, gate). The charge storage structure stores at least two charge storage states each associated with a different part of the charge storage structure, and the bias arrangement applied by the circuitry changes all of these charge storage states.

In some embodiments, the electrons which result form the instruction are caused from holes moving from the nonfloating region ("another region") to the substrate region.

Another aspect of the technology is a nonvolatile memory integrated circuit with an array of nonvolatile memory cells and controlling circuitry as described.

Another aspect of the technology is a method of operating such a nonvolatile memory integrated circuit.

In various embodiments, the nonvolatile memory cell of the array has varied features as disclosed herein. For example, the charge storage structure stores at least two charge storage states each associated with a different part of the charge storage structure, and the bias arrangement applied by the circuitry changes all of these charge storage states. In another example, the electrons which result from the instruction are caused from holes moving from the nonfloating region ("another region") to the substrate region.

In some embodiments, the floating region is electrically connected to a first bit line, and the nonfloating region is electrically connected a second bit line. In some embodiments, the aid gate is electrically connected a word line.

In various embodiments, the nonvolatile memory array is a virtual ground array, or a NAND array.

DETAILED DESCRIPTION

Figure 1A:
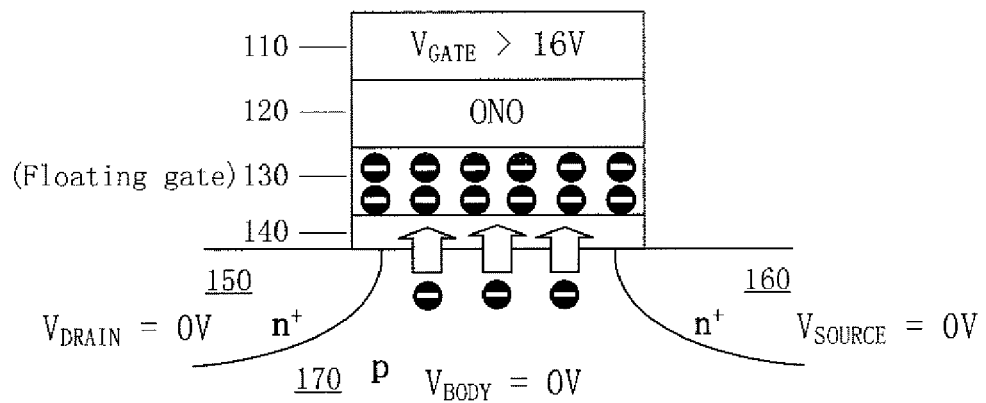
FIG. 1A shows a prior art operation being performed on a nonvolatile memory cell to add electrons to the floating gate.

FIG. 1A shows a prior art operation being performed on a nonvolatile memory cell to add electrons to the floating gate.

The p-doped substrate region 170 includes n+ doped drain and source regions 150 and 160. The remainder of the memory cell includes a bottom dielectric structure 140 on the substrate, a floating gate 130 on the bottom dielectric structure 140 (bottom oxide), a top dielectric structure 120 (oxide-nitride-oxide) on the floating gate 130, and a gate 110 on the dielectric structure 120. Representative top dielectric structures include oxide-nitride-oxide having a thickness in the range of about 5 to 20 nanometers, and preferably in the range of about 10 to 15 nanometers. Representative bottom dielectrics include silicon dioxide and silicon oxynitride having a thickness in the range of about 3 to 15 nanometers, and preferably in the range of about 8 to 12 nanometers. Other embodiments of bottom dielectrics include similar high dielectric constant materials including for example $Al_2O_3$. Representative floating gates are polysilicon having a thickness range of about 50 to 250 nanometers, and preferably in the range of about 100 to 200 nanometers.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni—Ti, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

In the diagram of FIG. 1A, the electrons are added to the floating gate, for example via Fowler-Nordheim injection into the floating gate 130, through the bottom oxide 140. In the bias arrangement of FIG. 1A, the voltage of the gate 110 is greater than 16 V, the voltage of the source 160 is 0 V, the voltage of the drain 150 is 0 V, and the voltage of the body 170 is 0 V.

Figure 1B:
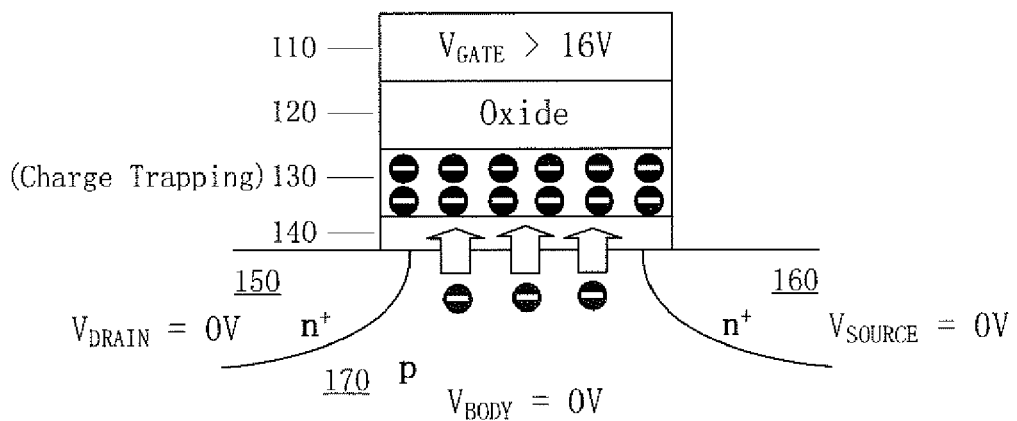
FIG. 1B shows a prior art operation being performed on a nonvolatile memory cell to add electrons to the charge trapping structure.

FIG. 1B shows a prior art operation being performed on a nonvolatile memory cell to add electrons to the charge trapping structure.

The memory cell of FIG. 1B is similar to memory cell of FIG. 1A. However, the charge storage structure is a charge trapping structure 130 rather than a floating gate. Charge trapping structures include silicon nitride having a thickness of about 3 to 9 nanometers, or other similar high dielectric constant materials, including metal oxides such as $Al_2O_3$, $HfO_2$, and others. The charge trapping structure may be a discontinuous set of pockets or particles of charge trapping material, or a continuous layer as shown in the drawing.

The memory cell for PHINES-like cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers. The bias arrangement of FIG. 1B is similar to the bias arrangement for FIG. 1A.

Figure 2A:
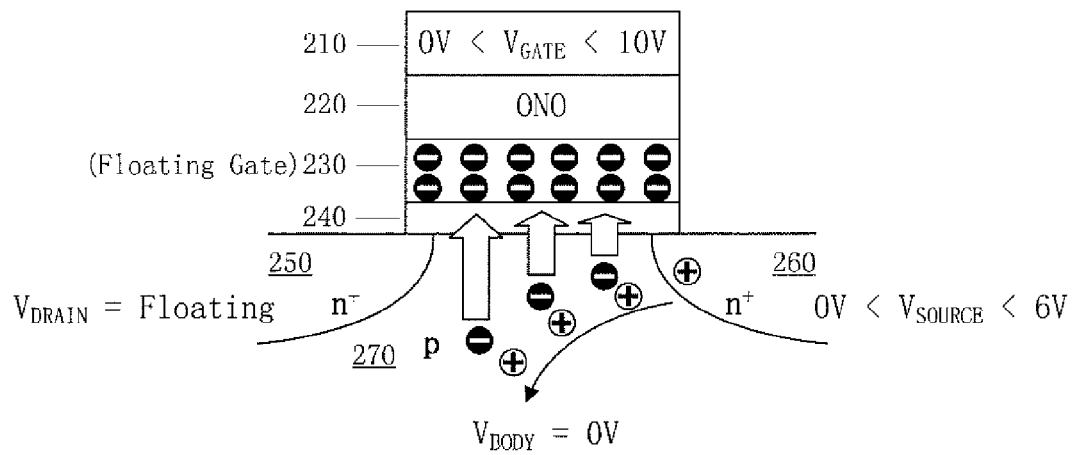
FIG. 2A shows an operation being performed on a nonvolatile memory cell to add electrons to the floating gate.

FIG. 2A shows an operation being performed on a nonvolatile memory cell to add electrons to the floating gate.

In the diagram of FIG. 2A, the holes are generated from the source 260 and flow to the body 270. As the holes flow to the body 270, impact ionization generates electron hole pairs. The resulting electrons are injected from the body 270 into the floating gate 230, through the bottom oxide 240. In the bias arrangement of FIG. 2A, the voltage of the gate 210 is between 0 V and 10 V, the voltage of the drain 250 is floating, the voltage of the source 260 is between 0 V and 6 V, and the voltage of the body 270 is 0 V.

Figure 2B:
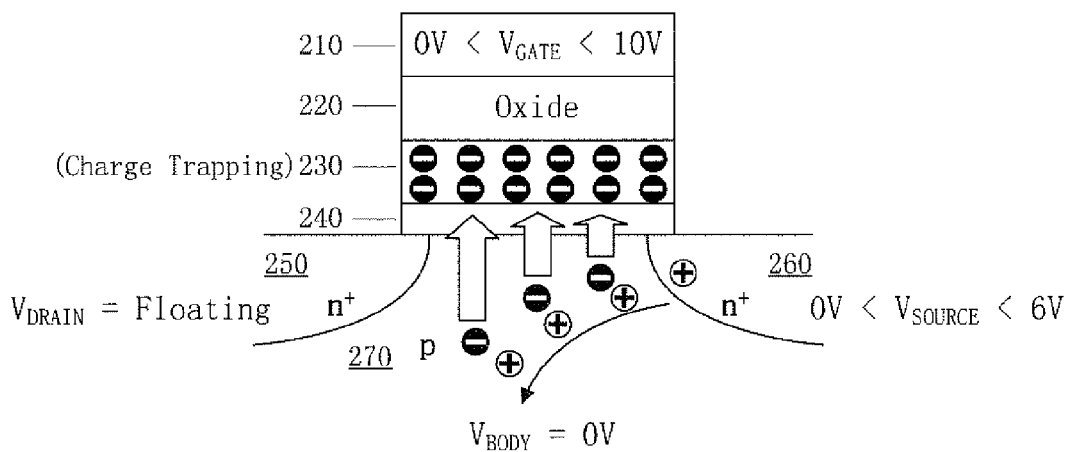
FIG. 2B shows an operation being performed on a nonvolatile memory cell to add electrons to the charge trapping structure.

FIG. 2B shows an operation being performed on a nonvolatile memory cell to add electrons to the charge trapping structure. The memory cell of FIG. 2B is similar to memory cell of FIG. 2A. However, the charge storage structure is a charge trapping structure 230 rather than a floating gate. The charge trapping structure 230 is capable of storing multiple charge storage states, such as one charge storage state with a corresponding threshold voltage on the left side of the charge trapping structure 230 and another charge storage state with another corresponding threshold voltage on the right side of the charge trapping structure 230. However, in the operation of FIG. 2B, electron injection occurs along the charge trapping structure 230, so all charge storage states are affected by the injected electrons.

Figure 3A:
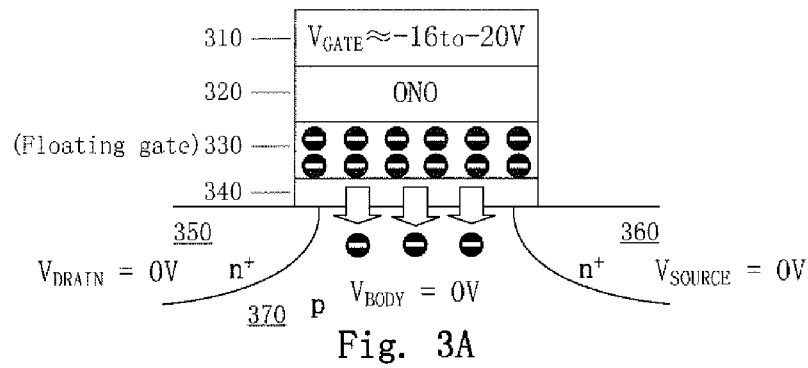
FIG. 3A shows an operation being performed on a nonvolatile memory cell to remove electrons from the floating gate.

FIG. 3A shows an operation being performed on a nonvolatile memory cell to remove electrons from the floating gate. The operation is similar to the operation of FIG. 1A, but with a reversed polarity between the gate and the body. In the diagram of FIG. 3A, the electrons are removed from the floating gate, for example via Fowler-Nordheim tunneling out of the floating gate 330, through the bottom oxide 340, into the body 370. In the bias arrangement of FIG. 3A, the voltage of the gate 310 is between about −16 V and −20 V, the voltage of the source 360 is 0 V, the voltage of the drain 350 is 0 V, and the voltage of the body 370 is 0 V.

Figure 3B:
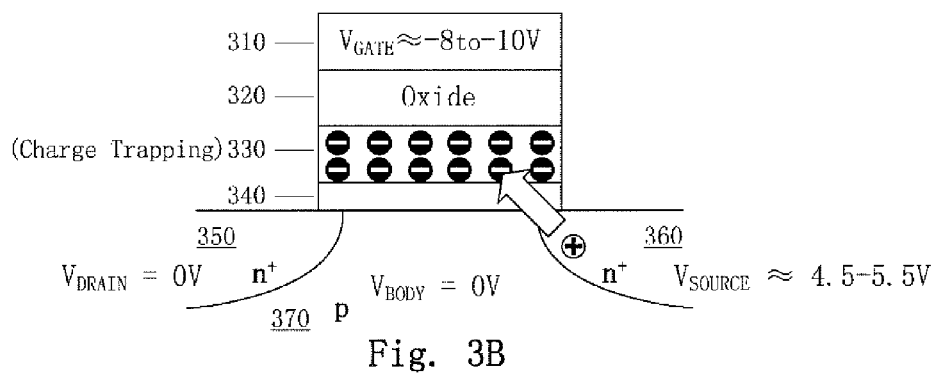
FIG. 3B shows an operation being performed on a nonvolatile memory cell to add holes to a part of the charge trapping structure.

FIG. 3B shows an operation being performed on a nonvolatile memory cell to add holes to a part of the charge trapping structure. The holes are added using band-to-band tunneling induced hot hole injection. As illustrated in FIG. 3B, holes are added to the right charge storage state of the charge trapping structure 330 by applying a gate voltage of about −8 to −10 V, a source voltage of about 4.5 to 5.5 V, a drain voltage of 0 V, and a body voltage of 0 V.

Figure 3C:
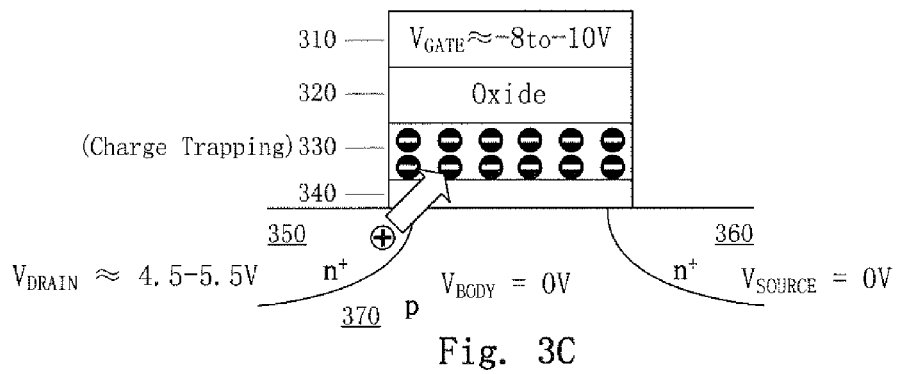
FIG. 3C shows an operation being performed on a nonvolatile memory cell to add holes to a different part of the charge trapping structure, in contrast with FIG. 3B.

FIG. 3C shows an operation being performed on a nonvolatile memory cell to add holes to a different part of the charge trapping structure, in contrast with FIG. 3B. As illustrated in FIG. 3C, holes are added to the left charge storage state of the charge trapping structure 330 by applying a gate voltage of about −8 to −10 V, a source voltage of 0 V, a drain voltage of about 4.5 to 5.5 V, and a body voltage of 0 V.

Other program and erase techniques can be used in operation algorithms applied to the PHINES type memory cell, as described for example in U.S. Pat. No. 6,690,601. Other memory cells and other operation algorithms might also be used.

Figure 4:
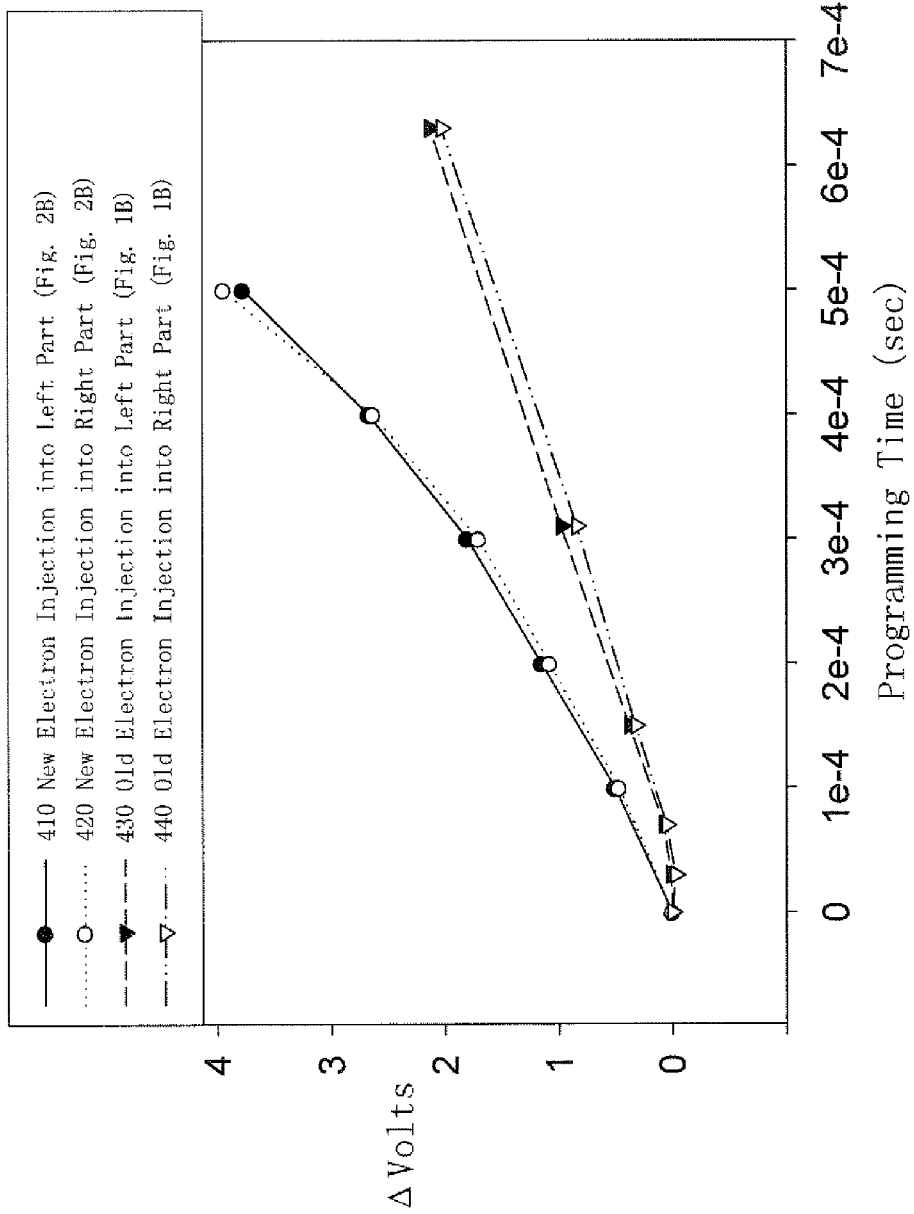
FIG. 4 is a graph of experimental results, showing the change in threshold voltage versus programming time for prior art operations and more effective operations being performed on a nonvolatile memory cell to add electrons to the charge trapping structure.

FIG. 4 is a graph of experimental results, showing the change in threshold voltage versus programming time for prior art operations and more effective operations being performed on a nonvolatile memory cell to add electrons to the charge trapping structure.

The channel length is 0.16 microns. Traces 410 and 420 respectively show the change in threshold voltage of the left and right charge storage states, after an operation to inject electrons into the left and right parts of the charge storage structure as shown in FIG. 2B, with a gate voltage of 10 V and a source voltage of 6 V. Traces 430 and 440 respectively show the change in threshold voltage of the left and right charge storage states, after an operation to inject electrons into the left and right parts of the charge storage structure as shown in FIG. 1B, with a gate voltage of 18 V.

The operation shown in FIG. 2B requires not only a lower magnitude gate voltage than the operation shown in FIG. 1B, the electron injection speed is much faster. For the operation shown in FIG. 2B, as the programming time increases in duration from 0 seconds to 0.5 milliseconds, the magnitude of threshold voltage change, associated with the right and left charge storage states, rises from about 0 V to about 4 V. However, for the operation shown in FIG. 1B, as the programming time increases in duration from 0 seconds to 0.5 milliseconds, the magnitude of threshold voltage change, associated with the right and left charge storage states, rises from about 0 V to only about 2V.

Figure 5A:
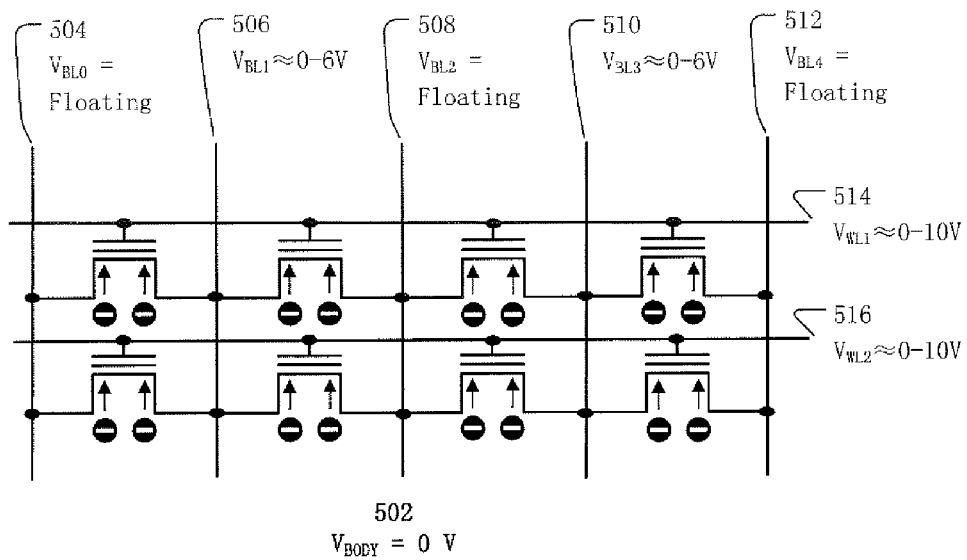
FIG. 5A shows an operation being performed on a virtual ground array of nonvolatile memory cells to add electrons to the charge storage structures of the nonvolatile memory cells.

FIG. 5A shows an operation being performed on a virtual ground array of nonvolatile memory cells to add electrons to the charge storage structures of the nonvolatile memory cells.

The virtual ground array is biased as follows. The word lines 514 and 516 have voltages of $V_{WL1}$ about 0 to 10 V, and $V_{WL2}$ about 0 to 10 V. The bit lines 504, 506, 508, 510, and 512 have voltages of $V_{BL0}$ floating, $V_{BL1}$ about 0 to 6 V, $V_{BL2}$ floating, $V_{BL3}$ about 0 to 6 V, and $V_{BL4}$ floating. With every other bit line floating, electrons are injected into all nonvolatile memory cells of the array, as according to either FIG. 2A or 2B.

Figure 5B:
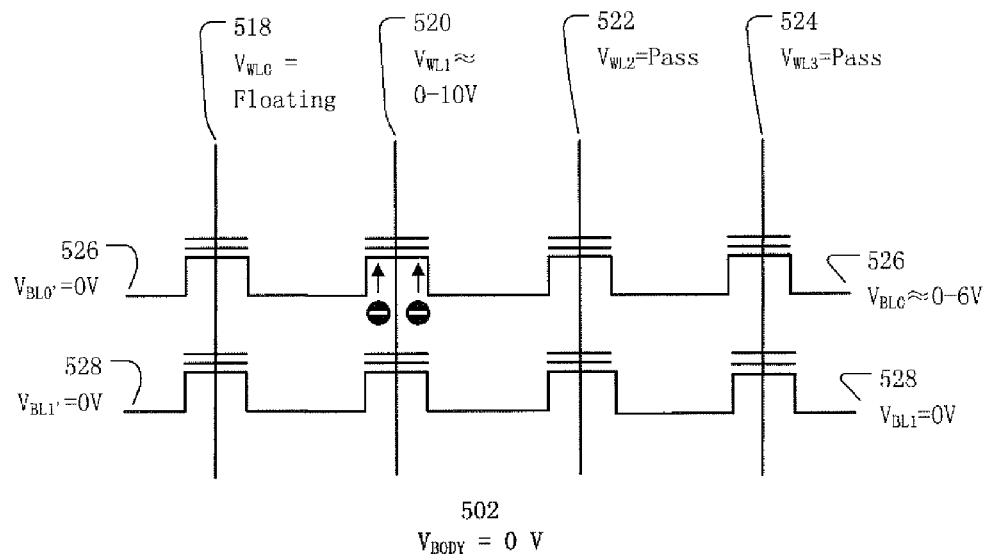
FIG. 5B shows an operation being performed on a NAND array of nonvolatile memory cells to add electrons to the charge storage structure of a selected nonvolatile memory cell.

FIG. 5B shows an operation being performed on a NAND array of nonvolatile memory cells to add electrons to the charge storage structure of a selected nonvolatile memory cell.

The NAND array is biased as follows. The bit line 526 has voltages of $V_{BL0}$ about 0 to 6 V on one end, and $V_{BL0'}$ 0 V on the other end. The bit line 528 has voltages of $V_{BL1}$ 0 V on one end, and $V_{BL1'}$ 0 V on the other end. The word lines 518, 520, 522, and 524 have voltages of $V_{WL0}$ floating, $V_{WL1}$ about 0 to 10 V, $V_{WL2}$ pass, and $V_{WL3}$ pass. A pass voltage is a voltage sufficiently high in magnitude to induce a channel between the source and drain regions, but sufficiently low in magnitude so that electrons are not injected into the charge storage structure. Accordingly, none of the nonvolatile memory cells of word lines 522 and 524 have electron injection into the charge storage structure. Because bit line 528 has 0V on one both ends, there is no potential difference to cause hole injection into the substrate, as required by either FIG. 2A or 2B. Accordingly, only the nonvolatile memory cell at the intersection of word line 520 and bit line 526 fulfills the conditions required for adding electrons to the charge storage structure.

Figure 6A:
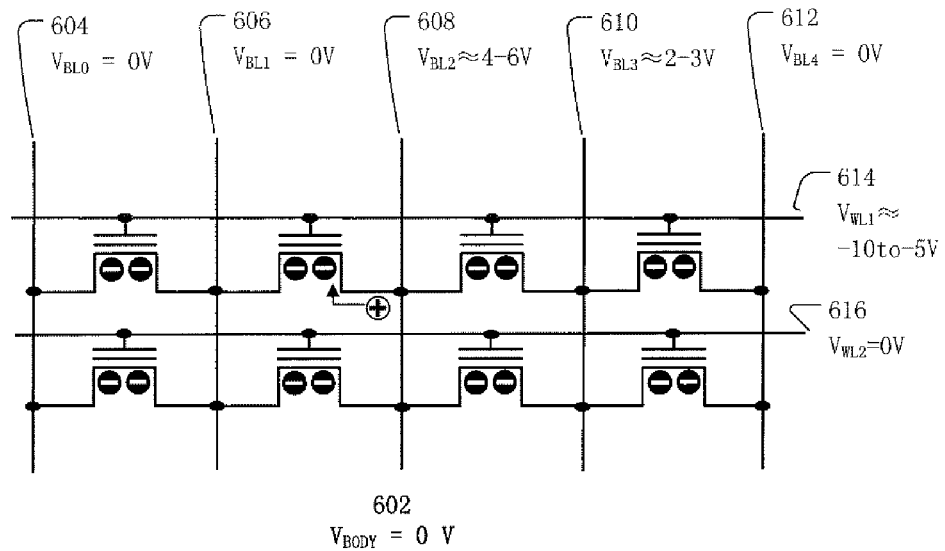
FIG. 6A shows an operation being performed on a virtual ground array of nonvolatile memory cells to add holes to the charge storage structure of a part of a selected nonvolatile memory cell.

FIG. 6A shows an operation being performed on a virtual ground array of nonvolatile memory cells to add holes to the charge storage structure of a part of a selected nonvolatile memory cell.

The virtual ground array is biased as follows. The word lines 614 and 616 have voltages of $V_{WL1}$ about −10 to −5 V, and $V_{WL2}$ about 0 V. The bit lines 604, 606, 608, 610, and 612 have voltages of $V_{BL0}$ 0 V, $V_{BL1}$ about 0 V, $V_{BL2}$ about 4 to 6 V, $V_{BL3}$ about 2 to 3 V, and $V_{BL4}$ 0 V. Only the nonvolatile memory cell at word line 614 and between bit lines 606 and 608 fulfills the conditions required for adding holes to the part of the charge storage structure by bit line 608, as according to FIG. 3B.

Figure 6B:
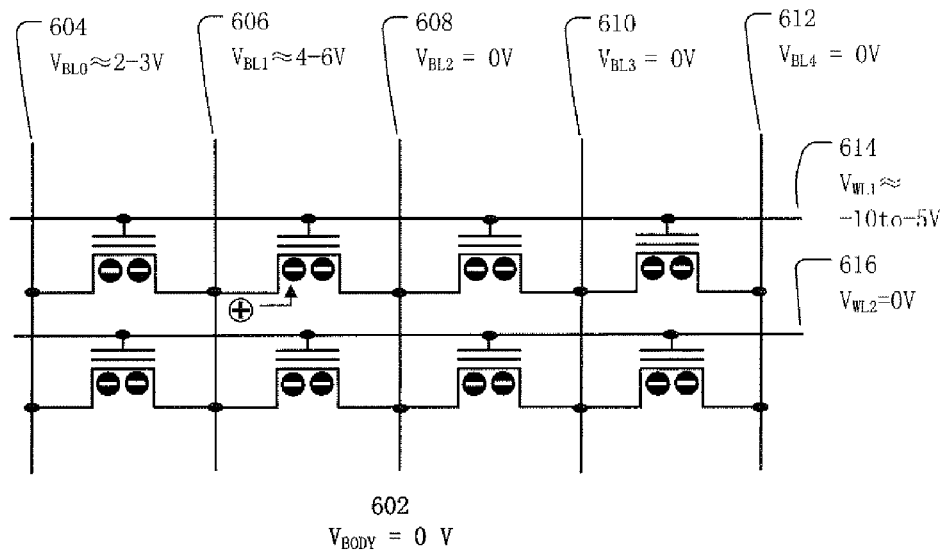
FIG. 6B shows an operation being performed on a virtual ground array of nonvolatile memory cells to add holes to the charge storage structure of a different part of a selected nonvolatile memory cell, in contrast with FIG. 6A.

FIG. 6B shows an operation being performed on a virtual ground array of nonvolatile memory cells to add holes to the charge storage structure of a different part of a selected nonvolatile memory cell, in contrast with FIG. 6A.

The virtual ground array is biased as follows. The word lines 614 and 616 have voltages of $V_{WL1}$ about −10 to −5 V, and $V_{WL2}$ about 0 V. The bit lines 604, 606, 608, 610, and 612 have voltages of $V_{BL0}$ about 2 to 3 V, $V_{BL1}$ about 4 to 6 V, $V_{BL2}$ 0 V, $V_{BL3}$ 0 V, and $V_{BL4}$ 0 V. Only the nonvolatile memory cell at word line 614 and between bit lines 606 and 608 fulfills the conditions required for adding holes to the part of the charge storage structure by bit line 606, as according to FIG. 3C.

Figure 6C:
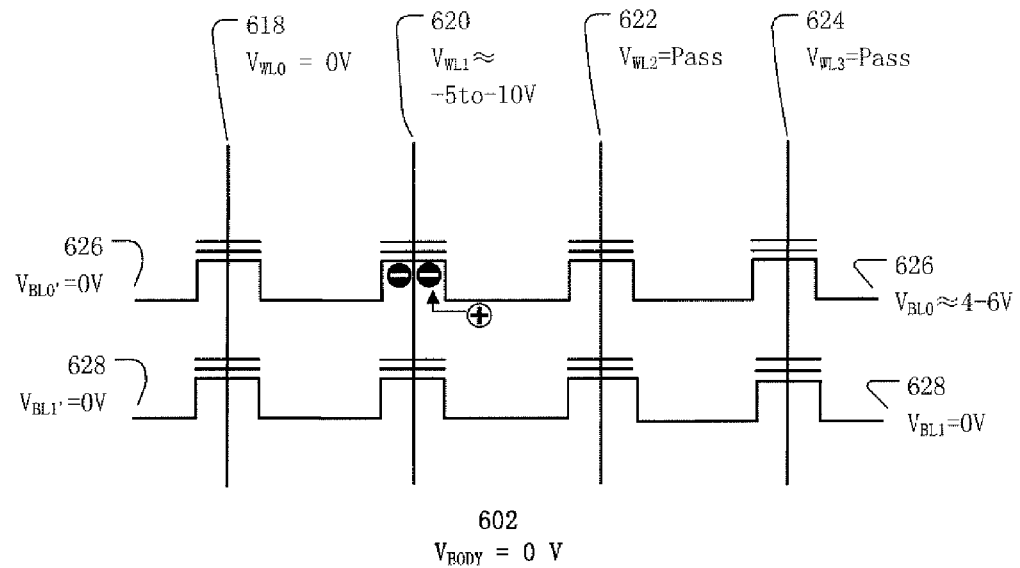
FIG. 6C shows an operation being performed on a NAND array of nonvolatile memory cells to add holes to the charge storage structure of a part of a selected nonvolatile memory cell.

FIG. 6C shows an operation being performed on a NAND array of nonvolatile memory cells to add holes to the charge storage structure of a part of a selected nonvolatile memory cell.

The NAND array is biased as follows. The bit line 626 has voltages of $V_{BL0}$ about 4 to 6 V on one end, and $V_{BL0'}$ 0 V on the other end. The bit line 628 has voltages of $V_{BL1}$ 0 V on one end, and $V_{BL1'}$ 0 V on the other end. The word lines 618, 620, 622, and 624 have voltages of $V_{WL0}$ 0 V, $V_{WL1}$ about −5 to −10 V, $V_{WL2}$ pass, and $V_{WL3}$ pass. Only the nonvolatile memory cell at the intersection of word line 620 and bit line 626 fulfills the conditions required for adding holes to the part of the charge storage structure closer to $V_{BL0}$ and further from $V_{BL0'}$, as according to FIG. 3B.

Figure 6D:
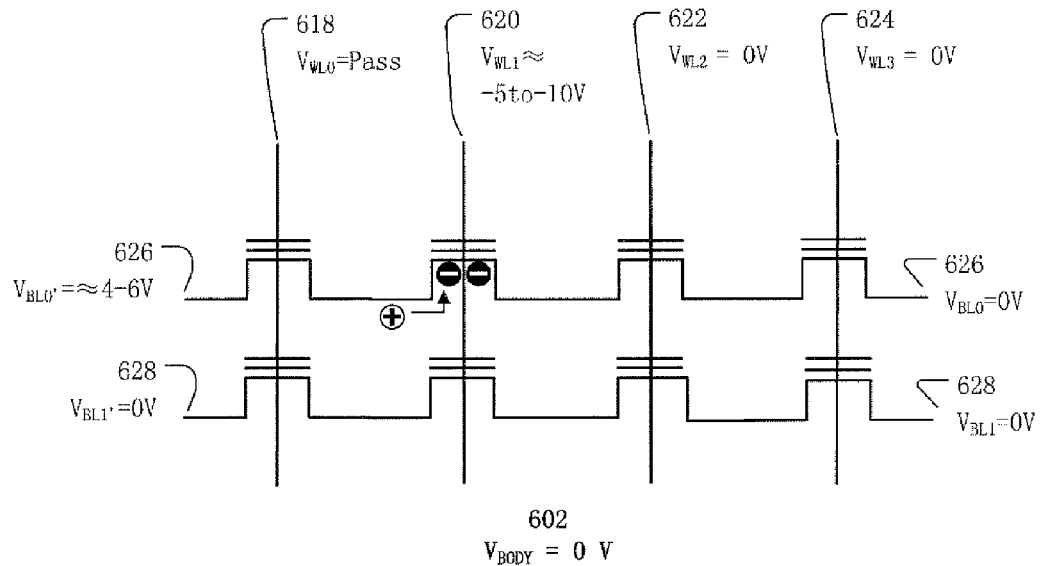
FIG. 6D shows an operation being performed on a NAND array of nonvolatile memory cells to add holes to the charge storage structure of a different part of a selected nonvolatile memory cell, in contrast with FIG. 6C.

FIG. 6D shows an operation being performed on a NAND array of nonvolatile memory cells to add holes to the charge storage structure of a different part of a selected nonvolatile memory cell, in contrast with FIG. 6C.

The NAND array is biased as follows. The bit line 626 has voltages of $V_{DL0}$ 0 V on one end, and $V_{BL0'}$ about 4 to 6 V on the other end. The bit line 628 has voltages of $V_{BL1}$ 0 V on one end, and $V_{BL1'}$ 0 V on the other end. The word lines 618, 620, 622, and 624 have voltages of $V_{WL0}$ pass, $V_{WL1}$ about −5 to −10 V, $V_{WL2}$ 0 V, and $V_{WL3}$ 0 V. Only the nonvolatile memory cell at the intersection of word line 620 and bit line 626 fulfills the conditions required for adding electrons to the part of the charge storage structure closer to $V_{BL0'}$ and further from $V_{BL0}$, as according to FIG. 3C.

Figure 6E:
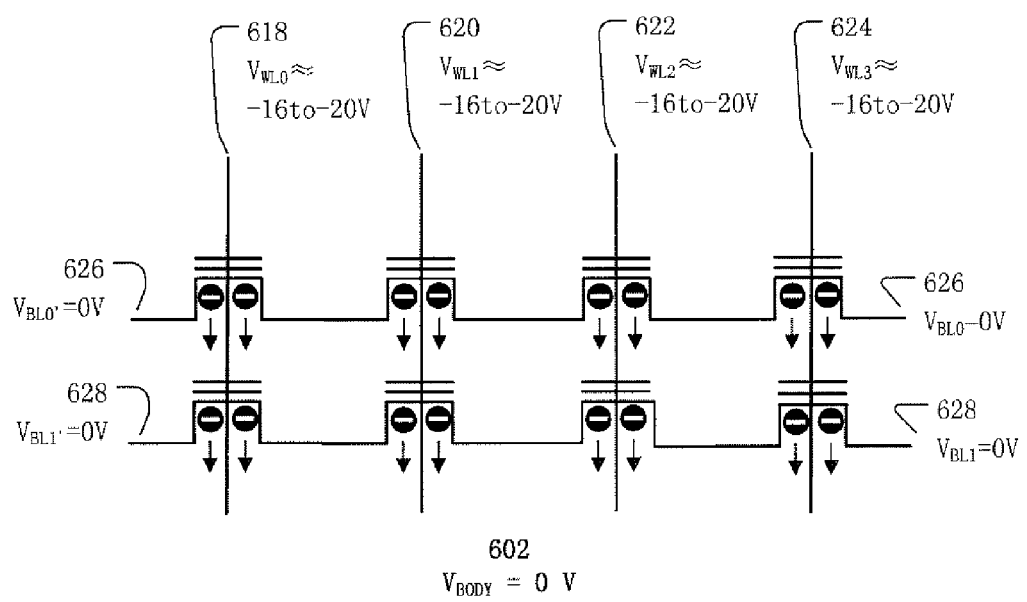
FIG. 6E shows an operation being performed on a NAND array of nonvolatile memory cells to remove electrons from the charge storage structures of the nonvolatile memory cells.

FIG. 6E shows an operation being performed on a NAND array of nonvolatile memory cells to remove electrons from the charge storage structures of the nonvolatile memory cells.

The NAND array is biased as follows. The bit line 626 has voltages of $V_{BL0}$ 0 V on one end, and $V_{BL0'}$ 0 V on the other end. The bit line 628 has voltages of $V_{BL1}$ 0 V on one end, and $V_{BL1'}$ 0 V on the other end. The word lines 618, 620, 622, and 624 have voltages of $V_{WL0}$ about −16 to −20 V, $V_{WL1}$ about −16 to −20 V, $V_{WL2}$ about −16 to −20 V, and $V_{WL3}$ about −16 to −20 V. Electrons are removed from all nonvolatile memory cells of the array, as according to either FIG. 3A.

Figure 7:
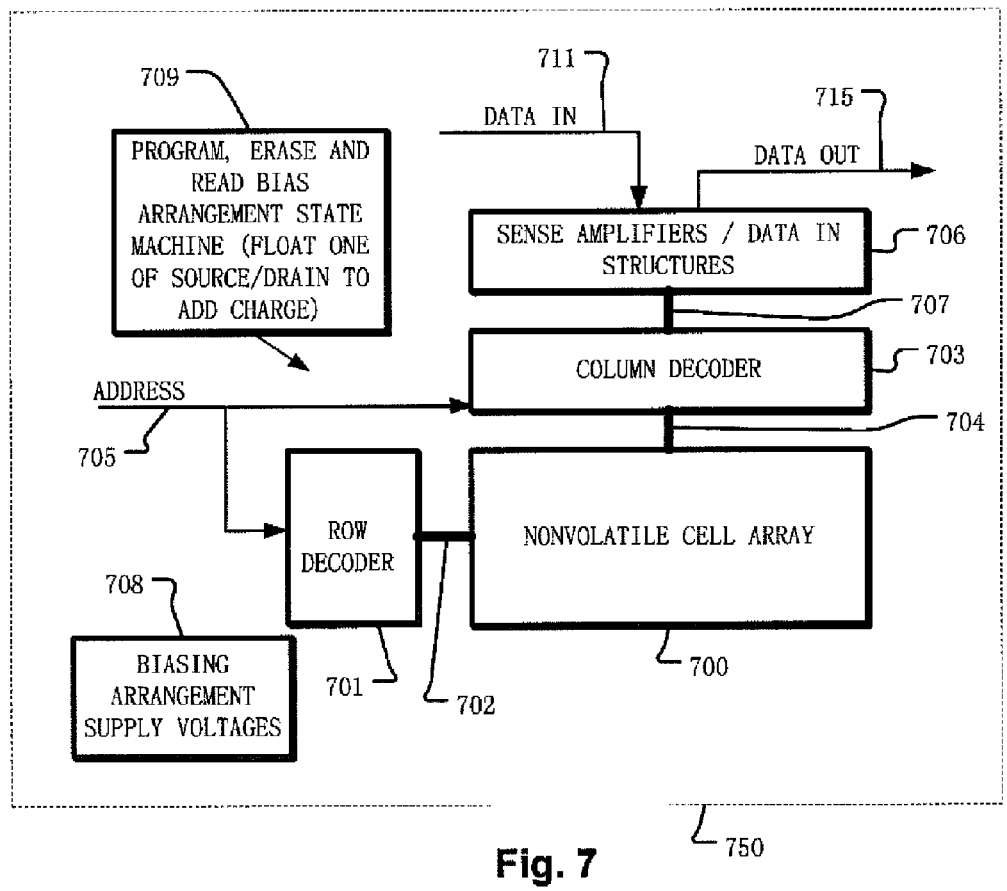
FIG. 7 is a block diagram of an exemplary nonvolatile memory integrated circuit with a bias arrangement control circuitry to float one of the source region or the drain region of one or more nonvolatile memory cells of a memory array, as disclosed herein.

FIG. 7 is a block diagram of an exemplary nonvolatile memory integrated circuit with a bias arrangement control circuitry to float one of the source region or the drain region of one or more nonvolatile memory cells of a memory array, as disclosed herein.

The integrated circuit 750 includes a memory array 700 of nonvolatile memory cells, on a semiconductor substrate. Each memory cells of array 700 has a modified channel region interface, such as a recessed channel region, or raised source and drain regions. The memory cells of array 700 may be individual cells, interconnected in arrays, or interconnected in multiple arrays. A row decoder 701 is coupled to a plurality of word lines 702 arranged along rows in the memory array 700. A column decoder 703 is coupled to a plurality of bit lines 704 arranged along columns in the memory array 700. Addresses are supplied on bus 705 to column decoder 703 and row decoder 701. Sense amplifier and data-in structures 706 are coupled to the column decoder 703 via data bus 707. Data is supplied via the data-in line 711 from input/output ports on the integrated circuit 750, or from other data sources internal or external to the integrated circuit 750, to the data-in structures in block 706. Data is supplied via the data-out line 715 from the sense amplifiers in block 706 to input/output ports on the integrated circuit 750, or to other data destinations internal or external to the integrated circuit 750. A bias arrangement state machine 709 controls the application of bias arrangement supply voltages 708, such as for the erase verify and program verify voltages, and the arrangements for programming, erasing, and reading the memory cells, in particular floating one of the source region and drain region to add charge, as shown herein.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An operation method of a semiconductor memory cell array, including a plurality of memory cells arranged as a NAND series, each memory cell of the plurality of memory cells having a gate terminal, a first current terminal, a second current terminal, a first charge trapping site, and a second charge trapping site, and a plurality of word lines connecting a plurality of gate terminals in rows, the operation method comprising:
   programming the first and second charge trapping sites of a selected memory cell by:
   biasing a first voltage to a selected word line of the selected memory cell;
   biasing a second voltage to a first end of the NAND series;
   grounding a second end of the NAND series; and
   floating a word line adjacent to the selected word line.

2. The method of claim 1, wherein said programming moves electrons to the first and second charge trapping sites.

* * * * *